(12) United States Patent
Jones et al.

(10) Patent No.: US 9,170,939 B1
(45) Date of Patent: Oct. 27, 2015

(54) EARLY DE-ALLOCATION OF WRITE BUFFER IN AN SSD

(71) Applicants: Western Digital Technologies, Inc., Irvine, CA (US); Skyera, LLC, San Jose, CA (US)

(72) Inventors: Justin Jones, Burlingame, CA (US); Andrew J. Tomlin, San Jose, CA (US); Rodney N. Mullendore, San Jose, CA (US); Radoslav Danilak, Cupertino, CA (US)

(73) Assignees: Western Digital Technologies, Inc., Irvine, CA (US); Skyera, LLC, San Jose, CA (US)

( * ) Notice: Subject to any disclaimer, the term of this patent is extended or adjusted under 35 U.S.C. 154(b) by 71 days.

(21) Appl. No.: 14/090,596

(22) Filed: Nov. 26, 2013

Related U.S. Application Data

(60) Provisional application No. 61/882,752, filed on Sep. 26, 2013.

(51) Int. Cl.
| | |
|---|---|
| *G06F 9/06* | (2006.01) |
| *G06F 12/02* | (2006.01) |
| *G11C 7/10* | (2006.01) |
| *G11C 16/06* | (2006.01) |

(52) U.S. Cl.
CPC .............. *G06F 12/0246* (2013.01); *G11C 7/10* (2013.01); *G11C 16/06* (2013.01)

(58) Field of Classification Search
CPC ....... G06F 12/0246; G11C 7/10; G11C 16/06
USPC ................................................... 711/103, 155
See application file for complete search history.

(56) References Cited

U.S. PATENT DOCUMENTS

| | | | |
|---|---|---|---|
| 8,458,381 B2 | 6/2013 | Holty et al. | |
| 2012/0204079 A1 | 8/2012 | Takefman et al. | |
| 2012/0311197 A1 | 12/2012 | Larson et al. | |
| 2012/0311231 A1 | 12/2012 | Porterfield | |
| 2013/0238838 A1* | 9/2013 | Fukutomi et al. | 711/103 |
| 2014/0082427 A1* | 3/2014 | Yamada et al. | 714/44 |
| 2014/0237205 A1* | 8/2014 | Takefman et al. | 711/162 |

* cited by examiner

*Primary Examiner* — Than Nguyen
(74) *Attorney, Agent, or Firm* — Wilmer Cutler Pickering Hale and Dorr LLP

(57) ABSTRACT

A data storage system includes: non-volatile solid state memory including non-volatile storage units and a temporary register; a data storage controller configured to receive a write command including a plurality of logical segments of data from a host; a write buffer allocated to receive a portion of the plurality of logical segments of data and accumulate a physical segment of data corresponding to a write unit of the solid state memory; a solid state memory controller configured to transmit the accumulated data from the write buffer to the temporary storage register each time the write buffer accumulates a physical segment of data. The data storage controller acknowledges completion of the write command to the host after the last logical segment of data is written to the write buffer; and deallocates the write buffer after the solid state memory completes reception of the accumulated data into the temporary storage register.

9 Claims, 3 Drawing Sheets

EARLY DE-ALLOCATION OF WRITE BUFFER IN AN SSD

CROSS-REFERENCE TO RELATED APPLICATION(S)

This application claims the benefit of U.S. provisional application No. 61/882,752, filed Sep. 26, 2013, the disclosure of which is hereby incorporated in its entirety by reference.

BACKGROUND

1. Technical Field

Apparatuses and methods consistent with the present inventive concept relate to data storage devices and more particularly to early de-allocation of a write buffer used to temporarily hold data before the data is sent to the data storage device.

2. Related Art

A data storage system may include various volatile and non-volatile storage devices such as a hard disk drive (HDD), an optical storage drive, and a solid state drive (SSD). In a SSD, a write buffer is used to temporarily hold data before it is sent to the memory controller to be written to the solid state memory, which may be, for example, but not limited to, a NAND device.

Generally, space in the write buffer is deallocated after the data in the write buffer is written successfully to the solid state memory. Referring to FIG. 1, data received by the SSD controller 110 is transferred by the controller front end 120 to the write buffer 130 where it is held before being sent to the memory controller 140. The memory controller 140 receives the data and transfers it to a temporary register 150 (e.g., page register that temporarily stores page(s) of data to be programmed) in the solid state memory 160 prior to the data being programmed into the nonvolatile memory units 170 of the solid state memory 160. After the data programming in the solid state memory 160 is completed successfully, the write buffer is de-allocated.

Programming the data from temporary register 150 to the solid state memory units 160 is a relatively time consuming operation (on the order of milliseconds) in comparison to other data transfer operations (on the order of microseconds) and causes significant delay in deallocating the write buffer. The delay in write buffer deallocation can result in reduced system throughput or require a large amount of buffer memory.

BRIEF DESCRIPTION OF THE DRAWINGS

Aspects and features of the present inventive concept will be more apparent by describing example embodiments with reference to the accompanying drawings, in which.

DETAILED DESCRIPTION

While certain embodiments are described, these embodiments are presented by way of example only, and are not intended to limit the scope of protection. The methods and systems described herein may be embodied in a variety of other forms. Furthermore, various omissions, substitutions, and changes in the form of the example methods and systems described herein may be made without departing from the scope of protection.

Overview

Some embodiments of the present inventive concept provide systems and methods for early de-allocation of a write buffer.

Figure 1:
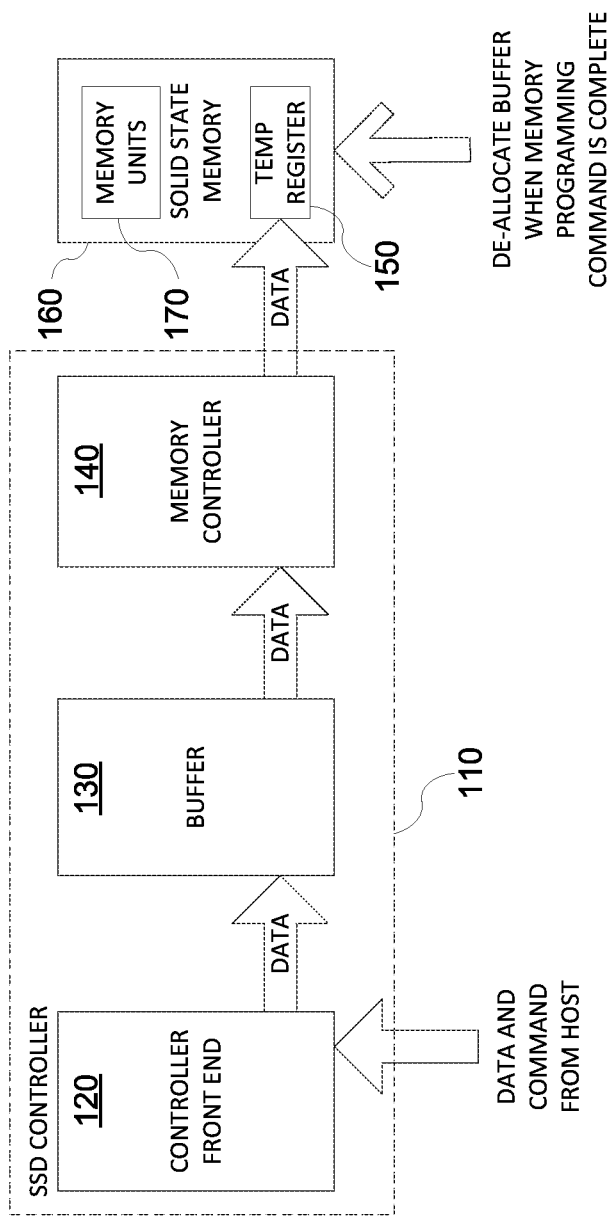
FIG. 1 is a block diagram for illustrating a related art write buffer deallocation.
Figure 2:
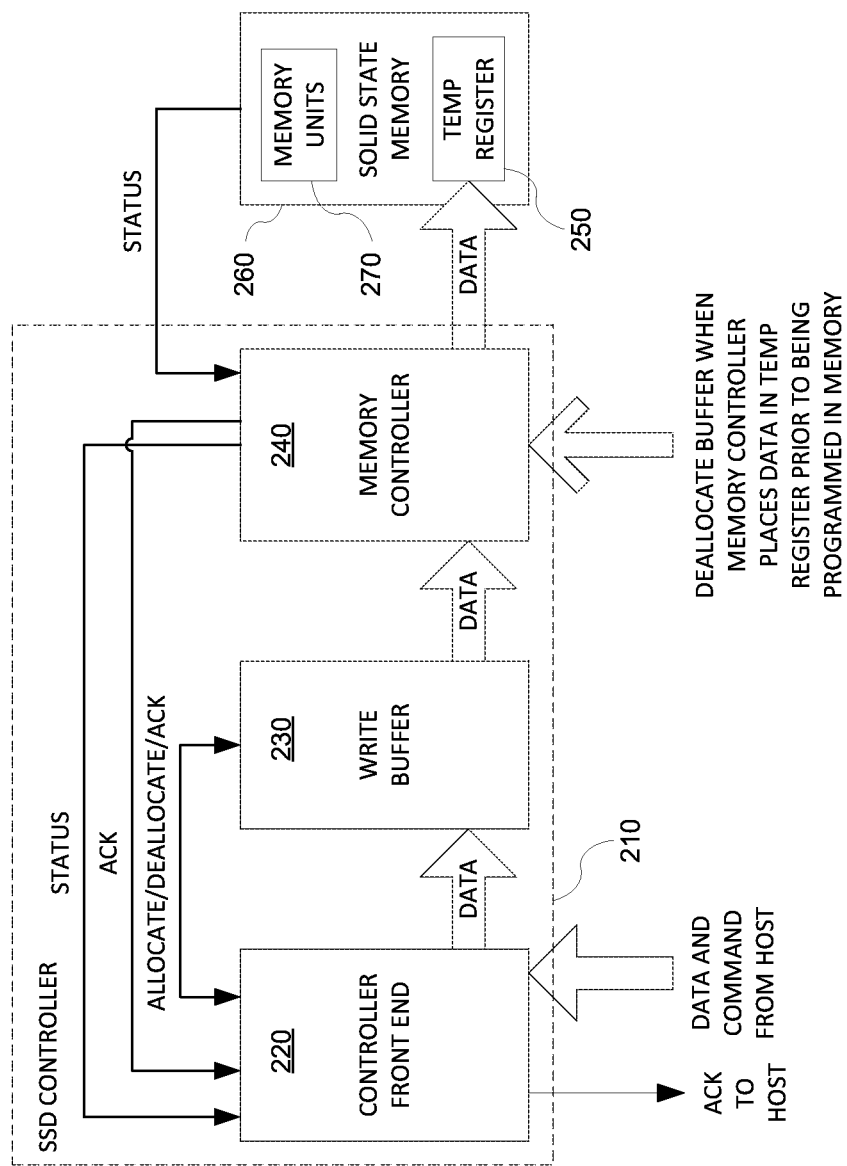
FIG. 2 is a block diagram for illustrating write buffer deallocation according to an example embodiment of the present inventive concept.

FIG. 2 is a block diagram for illustrating write buffer deallocation according to an example embodiment of the present inventive concept. A solid state drive controller may receive commands and data from a host, for example, but not limited to, a server, a desktop client, or other device configured to transmit commands and data. Referring to FIG. 2, a SSD controller (data storage controller) 210 includes a controller front end 220, a write buffer 230, and a solid state memory controller 240. The solid state memory controller 240 interfaces with a solid state memory 260 and transfers data to and from the solid state memory 260. Although only one solid state memory is illustrated, one of ordinary skill in the art will appreciate that a plurality of solid state memory devices may be included without departing from the scope of the present inventive concept.

Data received from the solid state memory controller 240 by the solid state memory 260 is temporarily stored in a register 250, for example, but not limited to, a 16 KB (kilobyte) page register, prior to being programmed into memory units 270 of the solid state memory 260. The solid state memory may include a plurality of temporary storage registers 250. The solid state memory 260 subsequently reads the data from the temporary storage register 250 and programs the data into non-volatile memory units 270 of the solid state memory 260.

Early De-Allocation of Write Buffer

Referring again to FIG. 2, the SSD controller (data storage controller) 210 may receive a write command from a host. The write command may include a plurality of logical segments of data. The controller front end 220 may allocate the write buffer 230 to receive at least a portion of the logical segments of data. The write buffer 230 may be configured as a plurality of buffers, where each of the plurality of buffers may be configured to accumulate a physical segment of data corresponding to a write unit of a nonvolatile solid state memory. A write unit is a smallest unit of data which can be written to a solid state memory, for example, a flash page in a solid state flash memory.

After the last logical segment of data from the plurality of logical segments of data included with the write command received by the SSD controller 210 have been transferred to the write buffer 230 by the controller front end 220, the SSD controller 210 transmits an acknowledgement signal to the host indicating that the write command has completed.

The write buffer 230 accumulates write units of data transferred by the controller front end 220 and after a write unit of data is accumulated in the write buffer 230, the write unit of data held in the write buffer 230 is transmitted to the solid state memory controller 240 which places the received data in a temporary register 250 in the solid state memory 260 prior to the data being programmed into the non-volatile memory units 270 of the solid state memory 260. The temporary register 250 in the solid state memory 260 may be configured as a plurality of registers. Multiple buffers within the write buffer 230 may accumulate write units of data prior to transferring the data to the temporary storage registers in the solid state memory 260.

According to an example embodiment of the present inventive concept, after the solid state memory controller 240 completes the data transfer to the temporary register 250 in the solid state memory 260, the solid state memory controller 240 transmits an acknowledgement signal to the controller front end 220. The controller front end 220 then deallocates the write buffer 230.

Thus, the write buffer 230 is deallocated after the data is stored in the temporary register 250 in the solid state memory 260 but before actual programming of the data to the nonvolatile memory units 270 is complete. Since the programming operation is relatively time consuming, de-allocating the buffer before completing the programming operation improves performance by reducing cycle time and enables the use of a smaller write buffer since buffer space becomes available sooner.

Upon completion of data programming into the nonvolatile memory units 270 by the solid state memory 260, the solid state memory 260 generates a programming status signal that indicates whether the data programming was successful. The programming status signal is transferred to the controller front end 220. While there can be a risk of data loss because the write buffer is de-allocated prior to the data being successfully programmed to the memory, the risk can be mitigated by the use of other nonvolatile memory, for example, but not limited to, magneto-resistive random access memory (MRAM), to store the data prior to transmitting it to the SSD controller, and/or using a Reed-Solomon coding scheme to enable data recovery.

In response to receiving a programming status signal indicating that data programming was unsuccessful, the SSD controller 210 may initiate data recovery procedures, for example, but not limited to re-reading the data from the memory unit indicated to be unsuccessfully programmed, reconstructing data using Reed-Solomon check pages, etc.

Figure 3:
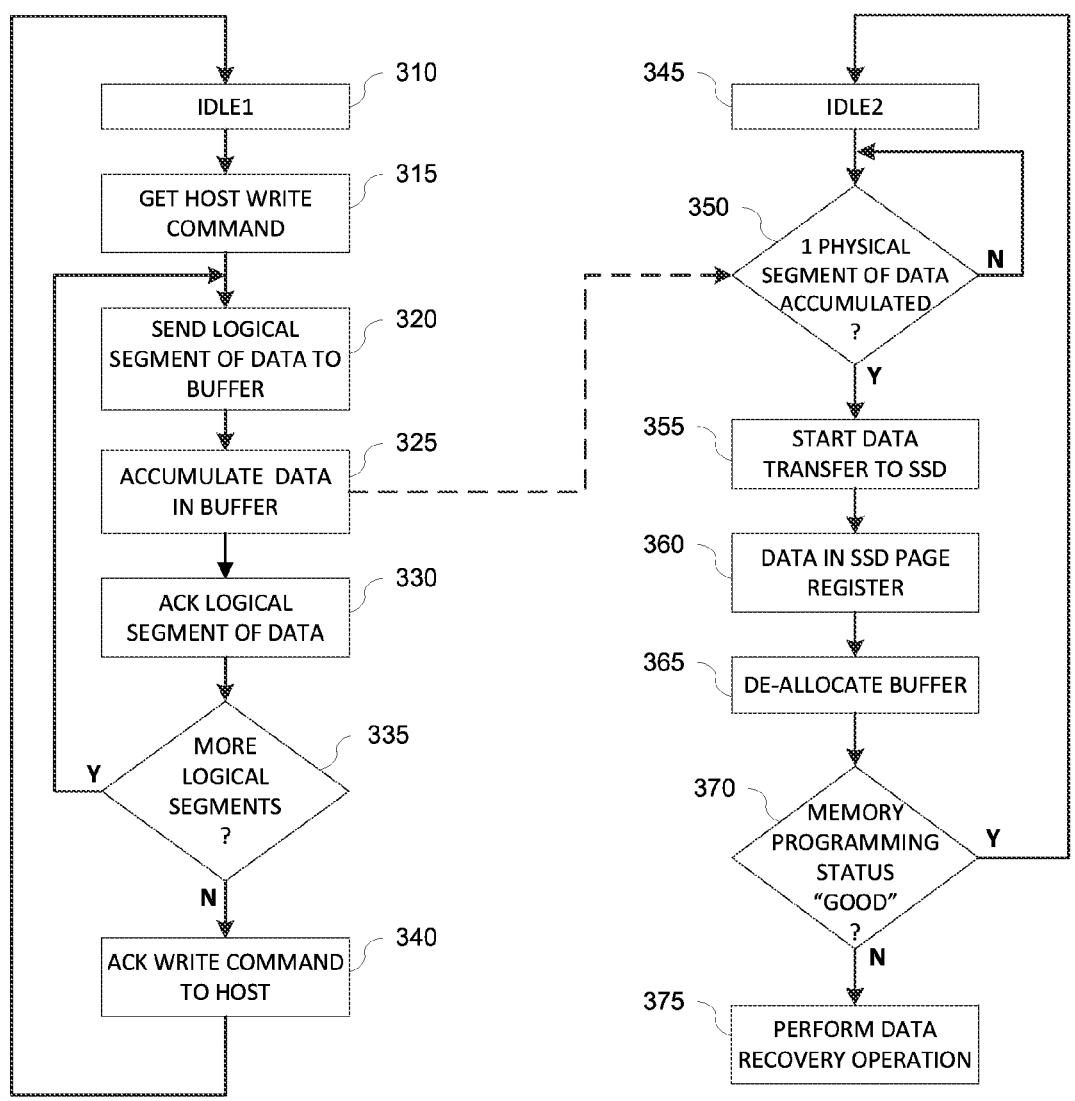
FIG. 3 is a flow chart illustrating a method of write buffer deallocation according to an example embodiment of the present inventive concept.

FIG. 3 is a flowchart illustrating an example embodiment of a method according to the present inventive concept.

Referring to FIG. 3, the SSD controller 210 receives a write command, which includes a plurality of logical segments of data, from the host (315) and a logical segment of data is sent to the write buffer 230 (320). The write buffer 230 acknowledges receipt of the logical segment of data to the SSD controller front end 220 (330). The process continues for all of the logical pages of data (335-Y). After the last logical segment of data has been sent to the write buffer 230 (335-N), the SSD controller 210 acknowledges completion of the write command to the host (340).

As data continues to accumulate in the buffers configured in the write buffer 230 (325), in a parallel operation when the write buffer 230 accumulates enough data to program a physical segment of data (i.e., a write unit) in the solid state memory 260 (350), the data is transferred to the solid state memory 260 by the solid state memory controller 240 (355) and stored in a temporary register 250 in the solid state memory 260 prior to the data being programming into the nonvolatile memory units 270 of the solid state memory 260 (360).

After each physical segment of data is placed into the temporary register 250 in the solid state memory 260, the solid state memory controller 240 sends an acknowledgement signal to the SSD controller front end 220, and the SSD controller 210 deallocates the write buffer 230 (365).

After the last write unit of data is programmed from the temporary register 250 into the nonvolatile memory units 270 of the solid state memory 260, the solid state memory 260 generates a programming status signal indicating whether the data programming was successful. The programming status signal is transferred to the controller front end 220.

In response to receiving a programming status signal indicating that data programming was unsuccessful (370-N), the SSD controller 210 may initiate data recovery procedures, for example, but not limited to re-reading the data from the memory unit indicated to be unsuccessfully programmed, reconstructing data using Reed-Solomon check pages, etc.

In example embodiments of the present inventive concept, multiple instances of operations 345-375 may execute with respect to multiple solid state memory devices within a solid state data storage system.

While certain embodiments have been described, these embodiments have been presented by way of example only, and are not intended to limit the scope of the protection. The methods and systems described herein may be embodied in a variety of other forms. Various omissions, substitutions, and/or changes in the form of the example methods and systems described herein may be made without departing from the spirit of the protection.

The accompanying claims and their equivalents are intended to cover such forms or modifications as would fall within the scope and spirit of the protection. For example, the example systems and methods disclosed herein may be applied to hard disk drives, hybrid hard drives, and the like. In addition, other forms of storage, for example, but not limited to, DRAM or SRAM, battery backed-up volatile DRAM or SRAM devices, EPROM, EEPROM memory, etc., may additionally or alternatively be used. As another example, the various components illustrated in the figures may be implemented as software and/or firmware on a processor, ASIC/FPGA, or dedicated hardware. Also, the features and attributes of the specific example embodiments disclosed above may be combined in different ways to form additional embodiments, all of which fall within the scope of the present disclosure.

Although the present disclosure provides certain example embodiments and applications, other embodiments that are apparent to those of ordinary skill in the art, including embodiments which do not provide all of the features and advantages set forth herein, are also within the scope of this disclosure. Accordingly, the scope of the present disclosure is intended to be defined only by reference to the appended claims.

What is claimed is:

1. A data storage system, comprising:
   non-volatile solid state memory comprising non-volatile storage units and a temporary register;
   a data storage controller configured to receive a write command including a plurality of logical segments of data from a host;
   a write buffer allocated by the controller to receive a portion of the plurality of logical segments of data and accumulate a physical segment of data corresponding to a write unit of the solid state memory; and
   a solid state memory controller coupled to the non-volatile solid state memory, the solid state memory controller configured to transmit the accumulated data from the write buffer to the temporary storage register in the solid state memory each time the write buffer accumulates a physical segment of data,
   wherein the data storage controller is further configured to:
      acknowledge completion of the write command to the host after the last logical segment of data is written to the write buffer; and deallocate the write buffer after the solid state memory completes reception of the accumulated data from the write buffer into the temporary storage register.

2. The data storage system of claim 1, wherein the solid state memory is further configured to, after receiving the data from the write buffer into the temporary register, program the data from the temporary register to a memory unit in the solid state memory.

3. The data storage system of claim 2, wherein the data storage controller is further configured to, in response to a data programming status from the solid state memory indicating unsuccessful data programming, initiate a data recovery procedure to recover the unsuccessfully programmed data.

4. An apparatus for controlling a buffer, the apparatus comprising:
   a solid state drive controller configured to receive a write command including a plurality of logical segments of data from a host; and
   a buffer allocated by the solid state drive controller to receive a portion of the plurality of logical segments of data and accumulate a physical segment of data corresponding to a write unit of a nonvolatile solid state memory coupled to the apparatus;
   wherein the solid state memory comprises a temporary register configured to receive the accumulated data from the buffer each time the buffer accumulates a physical segment of data, and
   wherein the solid state drive controller is configured to:
      acknowledge completion of the write command to the host after the last logical segment of data is written to the buffer; and
      deallocate the buffer after the solid state memory temporary register completes reception of the accumulated data from the buffer.

5. The apparatus of claim 4, wherein the solid state memory is further configured to:
   after receiving the data from the buffer into the temporary register, program the data from the temporary register to a memory unit in the solid state memory; and
   transmit a data programming status signal to a front end of the solid state drive controller,
   wherein in response to the data programming status signal from the solid state memory indicating unsuccessful data programming, the solid state drive controller initiates data recovery procedures to recover the unsuccessfully programmed data.

6. A method of controlling a buffer, the method comprising:
   receiving a write command including a plurality of logical segments of data from a host;
   allocating the buffer to receive a portion of the plurality of logical segments of data;
   transferring each logical segment of data to the buffer;
   accumulating in the buffer a predetermined physical segment of data corresponding to a write unit of a nonvolatile solid state memory;
   transferring the accumulated data from the buffer to a register in the solid state memory via a solid state memory controller for temporary storage each time the buffer accumulates the predetermined physical segment of data;
   acknowledging completion of the write command to the host after the last logical segment of data is written to the buffer; and
   deallocating the buffer after the data transfer from the buffer to the solid state memory register is complete.

7. The method of claim 6, further comprising:
   writing the accumulated data temporarily stored in the solid state memory register to a memory unit of the solid state memory;
   determining whether the accumulated data is successfully written to the solid state memory unit; and
   transmitting a data programming status signal from the solid state memory to the solid state memory controller.

8. The method of claim 7, wherein in response to a data programming status signal from the solid state memory indicating that the data is unsuccessfully written to memory, performing data recovery procedures to recover the unsuccessfully programmed data.

9. The method of claim 7, wherein the memory is a flash memory and the predetermined physical segment of data is a physical segment of data comprising a flash memory page of data.

* * * * *